(12) United States Patent
Kim et al.

(10) Patent No.: US 7,256,091 B2
(45) Date of Patent: Aug. 14, 2007

(54) METHOD OF MANUFACTURING A SEMICONDUCTOR DEVICE WITH A SELF-ALIGNED POLYSILICON ELECTRODE

(75) Inventors: Taek-Jung Kim, Gyeonggi-do (KR); Min Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 117 days.

(21) Appl. No.: 11/149,702

(22) Filed: Jun. 9, 2005

(65) Prior Publication Data

US 2005/0287763 A1   Dec. 29, 2005

(30) Foreign Application Priority Data

Jun. 29, 2004  (KR) ................. 10-2004-0049250

(51) Int. Cl.
  H01L 21/336   (2006.01)
  H01L 21/3205  (2006.01)
  H01L 21/4763  (2006.01)
  H01L 21/302   (2006.01)

(52) U.S. Cl. .................. 438/264; 438/593; 438/692; 257/E21.209; 257/E21.304; 257/E21.422; 257/E21.68

(58) Field of Classification Search ........... 438/264, 438/593, 692; 257/E21.209, E21.304, E21.422, 257/E21.68
See application file for complete search history.

(56) References Cited

U.S. PATENT DOCUMENTS 5,922,619 A * 7/1999 Larkin ................ 438/692
6,221,715 B1 * 4/2001 Chen ................. 438/257
6,326,263 B1 * 12/2001 Hsieh ................ 438/257

(Continued)

FOREIGN PATENT DOCUMENTS

JP   2002-208629   7/2002
KR   2004-0005230  1/2004

OTHER PUBLICATIONS

English language abstract of the Korean Publication No. 2004-0005230.
English language abstract of the Japanese Publication No. 2002-208629.

*Primary Examiner*—Michael Lebentritt
*Assistant Examiner*—Ron Pompey
(74) *Attorney, Agent, or Firm*—Marger Johnson & McCollom, P.C.

(57) ABSTRACT

In a method of manufacturing a semiconductor device, an isolation pattern is formed on a substrate. The isolation pattern includes an opening that exposes a portion of the substrate. A preliminary polysilicon layer is formed on the substrate and the isolation pattern to partially fill up the opening. A sacrificial layer is formed on the preliminary polysilicon layer. The sacrificial layer is partially etched to expose a portion of the preliminary polysilicon layer formed on a shoulder portion of the isolation pattern. A first polysilicon layer is formed by etching the exposed portion of the preliminary polysilicon layer to enlarge an upper width of the opening. After the etched sacrificial layer is removed, a second polysilicon layer is formed on the first polysilicon layer to fill up the enlarged opening. Because the upper width of the opening is larger than the lower width, no seam or void would be generated in the second polysilicon layer, therefore improving the electrical characteristics and reliability of the device.

24 Claims, 9 Drawing Sheets

U.S. PATENT DOCUMENTS

| | | | |
|---|---|---|---|
| 6,475,894 B1 * | 11/2002 | Huang et al. | 438/593 |
| 6,924,220 B1 * | 8/2005 | Yang et al. | 438/593 |
| 7,183,153 B2 * | 2/2007 | Lutze et al. | 438/201 |
| 2001/0002714 A1 * | 6/2001 | Doan | 257/316 |
| 2002/0025631 A1 * | 2/2002 | Bez et al. | 438/257 |
| 2002/0102793 A1 * | 8/2002 | Wu | 438/257 |
| 2002/0190307 A1 * | 12/2002 | Tuan et al. | 257/315 |
| 2004/0163324 A1 * | 8/2004 | Lee et al. | 51/306 |

* cited by examiner

METHOD OF MANUFACTURING A SEMICONDUCTOR DEVICE WITH A SELF-ALIGNED POLYSILICON ELECTRODE

CROSS REFERENCE TO RELATED APPLICATIONS

This application claims priority under 35 USC § 119 to a Korean Patent Application No. 2004-49250 filed on Jun. 29, 2004 the contents of which are incorporated herein by reference in their entirety.

BACKGROUND OF THE INVENTION

1. Field of the Invention

The present invention relates to a method of manufacturing a semiconductor device. More particularly, the present invention relates to a method of manufacturing a semiconductor device including a self-aligned polysilicon layer having no seam or void therein.

2. Description of the Related Art

Semiconductor devices are generally divided into volatile semiconductor devices, such as dynamic random access memory (DRAM) devices or static random access memory (SRAM) devices, and non-volatile semiconductor devices like a read only memory (ROM) devices. Volatile semiconductor devices have a relatively high response speed; however, data stored therein may be lost with the lapse of time. Although non-volatile semiconductor devices permanently store data therein, such devices have a relatively low response speed.

Recently, non-volatile semiconductor devices such as flash memory devices or electrically erasable and programmable ROM (EEPROM) devices have been widely used in various electronic apparatuses. In flash memory devices, data may be electrically stored and/or read out from memory cells of the flash memory devices by employing either the Flower-Nordheim tunneling effect or hot carrier injection effect. Flash memory devices are typically divided into a NAND type memory device and a NOR type memory device. In the NAND type memory device, a plurality of cell transistors is serially connected to form unit strings and the unit strings are connected in parallel to a bit line and a ground line. In the NOR type memory device, each of the cell transistors is electrically connected in parallel between a bit line and a ground line. Both have their respective advantages: the NAND type memory device may have a relatively high response speed, while the NOR type memory device has a relatively high integration.

Memory cells used in flash memory devices typically have a vertically stacked gate structure that includes a floating gate formed on a silicon substrate. The stacked gate structure generally has at least one tunnel oxide layer or dielectric layer, and a control gate formed on or near the floating gate. In the memory cell of the NAND type memory device, a plurality of floating gates is formed in an active region having a line shape. Here, the floating gates are intended to be exactly formed at predetermined portions of the active region. However, due to decreasing design rules, the floating gates may not be precisely formed at the predetermined portions of the active region due to the active region's greatly reduced size. That is, the critical dimensions of the floating gate decrease much more quickly than the design rules for flash memory devices as a whole.

To solve the above-mentioned problem, there has been developed a method of forming a floating gate including a self-aligned polysilicon (SAP) layer. In this method, after an opening is formed through an isolation layer, a polysilicon layer is formed to fill up the opening, thereby forming the floating gate. However, poor step coverage may cause the polysilicon layer to not completely fill up the opening when the opening, thereby forming a seam in the polysilicon layer. This seam formation problem is further exacerbated by the fact that openings formed through the isolation layer generally have an upper portion relatively narrower than a lower portion thereof.

FIG. 1 is a cross sectional view illustrating a seam generated in a polysilicon layer for a floating gate of a conventional flash memory device.

As shown in FIG. 1, a seam 12 is inadvertently formed in a polysilicon layer 10 when filling the opening formed through an isolation layer 15. This seam might not be completely removed in a subsequent process for forming a floating gate, therefore resulting in an undesired electrical effect. That is, oxide may form in the seam 12 in a successive process thereby degrading the electrical characteristics of the flash memory device.

SUMMARY OF THE INVENTION

The present invention provides a method of manufacturing a semiconductor device including a polysilicon layer without a seam or a void therein.

The present invention also provides a method of manufacturing a semiconductor device including a polysilicon layer to improve electrical characteristics and reliability thereof.

In accordance with one aspect of the present invention, there is provided a method of manufacturing a semiconductor device. In the method, an isolation pattern is formed on a substrate. The isolation pattern includes an opening that exposes a portion of the substrate. A preliminary polysilicon layer is formed on the substrate and the isolation pattern to partially fill up the opening. After a sacrificial layer is formed on the preliminary polysilicon layer, the sacrificial layer is partially etched to expose a portion of the preliminary polysilicon layer formed on a shoulder portion of the isolation pattern. A first polysilicon layer is formed by etching the exposed portion of the preliminary polysilicon layer to enlarge an upper width of the opening. After the etched sacrificial layer is removed, a second polysilicon layer is formed on the first polysilicon layer to fill up the enlarged opening.

In an exemplary embodiment of the present invention, the sacrificial layer may have a first thickness from a portion of the preliminary polysilicon layer positioned on a bottom face of the opening, and may have a second thickness substantially thinner than the first thickness from a portion of the preliminary polysilicon layer positioned on a sidewall of the opening. The sacrificial layer may be formed by a high density plasma chemical vapor deposition (HDP-CVD) process.

In an exemplary embodiment of the present invention, the sacrificial layer may have a first thickness from a portion of the preliminary polysilicon layer positioned on a bottom face of the opening, and may have a second thickness substantially thinner than the first thickness from a portion of the preliminary polysilicon layer positioned on the isolation pattern. The sacrificial layer may include undoped silicate glass (USG), boro-phosphor silicate glass (BPSG), flowable oxide (FOX), etc.

In an exemplary embodiment of the present invention, the sacrificial layer may be partially etched and then removed by wet etching processes. Each of the wet etching processes may be performed using an etching solution including a diluted hydrogen fluoride (HF) solution or an LAL solution.

In an exemplary embodiment of the present invention, the first polysilicon layer may be formed by a wet etching process using an etching solution having an etching selectivity of above about 1:10 between the sacrificial layer and the preliminary polysilicon layer. The etching solution may include ammonium hydroxide ($NH_4OH$), hydrogen peroxide ($H_2O_2$) and deionized water with a volume ratio of about 3 to about 10: about 1: about 60 to about 200.

In accordance with another aspect of the present invention, there is provided a method of manufacturing a semiconductor device. In the method, after a mask pattern is formed on a substrate, trenches are formed on the substrate by etching the substrate using the mask pattern as an etching mask. Isolation layers are formed to fill up the trenches, and then an opening is formed by removing the mask pattern to expose an active region of the substrate between the isolation layers. A first dielectric layer is formed on the exposed active region. A preliminary polysilicon layer is formed on the first dielectric layer and the isolation layers to partially fill up the opening. A sacrificial layer is formed on the preliminary polysilicon layer. The sacrificial layer has a first thickness from a portion of the preliminary polysilicon layer positioned on a bottom face of the opening, and has a second thickness substantially thinner than the first thickness from a portion of the preliminary polysilicon layer positioned on a sidewall of the opening. The sacrificial layer is partially etched to expose a portion of the preliminary polysilicon layer formed on a shoulder portion of the opening. A first polysilicon layer is formed by etching the exposed portion of the preliminary polysilicon layer to enlarge an upper width of the opening. Then, the etched sacrificial layer is removed. After a second polysilicon layer is formed on the first polysilicon layer to fill up the enlarged opening, a floating gate is formed by removing the second and first polysilicon layers until the isolation layers are exposed.

In an exemplary embodiment of the present invention, after the isolation layers are partially removed to partially expose a sidewall of the floating gate, a second dielectric layer is formed on the floating gate. Then, a control gate is formed on the second dielectric layer.

In accordance with another aspect of the present invention, there is provided a method of manufacturing a semiconductor device. In the method, a mask pattern is formed on a substrate, and then trenches are formed on the substrate by etching the substrate using the mask pattern as an etching mask. After isolation layers are formed to fill up the trenches, an opening is formed by removing the mask pattern to expose an active region of the substrate between the isolation layers. A first dielectric layer is formed on the exposed active region. A preliminary polysilicon layer is formed on the first dielectric layer and the isolation layers to partially fill up the opening. A sacrificial layer is formed on the preliminary polysilicon layer. The sacrificial layer has a first thickness from a portion of the preliminary polysilicon layer positioned on a bottom face of the opening, and has a second thickness substantially thinner than the first thickness from a portion of the preliminary polysilicon layer positioned on the isolation layers. The sacrificial layer is partially etched to expose portions of the preliminary polysilicon layer formed on the isolation layer and a shoulder portion of the opening. A first polysilicon layer is formed by etching the exposed portions of the preliminary polysilicon layer to enlarge an upper width of the opening. After the etched sacrificial layer is removed, a second polysilicon layer is formed on the first polysilicon layer to fill up the enlarged opening. Then, a floating gate is formed by removing the second and first polysilicon layers until the isolation layers are exposed.

According to the present invention, no seam or void is generated in a polysilicon layer for a floating gate while the polysilicon layer is formed in a self-aligned process relative to an isolation layer formed on a substrate. Therefore, a semiconductor device including the polysilicon layer such as a flash memory device may have improved electrical characteristics and reliability.

BRIEF DESCRIPTION OF THE DRAWINGS

The above and other features and advantages of the present invention will become readily apparent by reference to the following detailed description when considered in conjunction with the accompanying drawings wherein.

DESCRIPTION OF THE EMBODIMENTS

Figure 1:
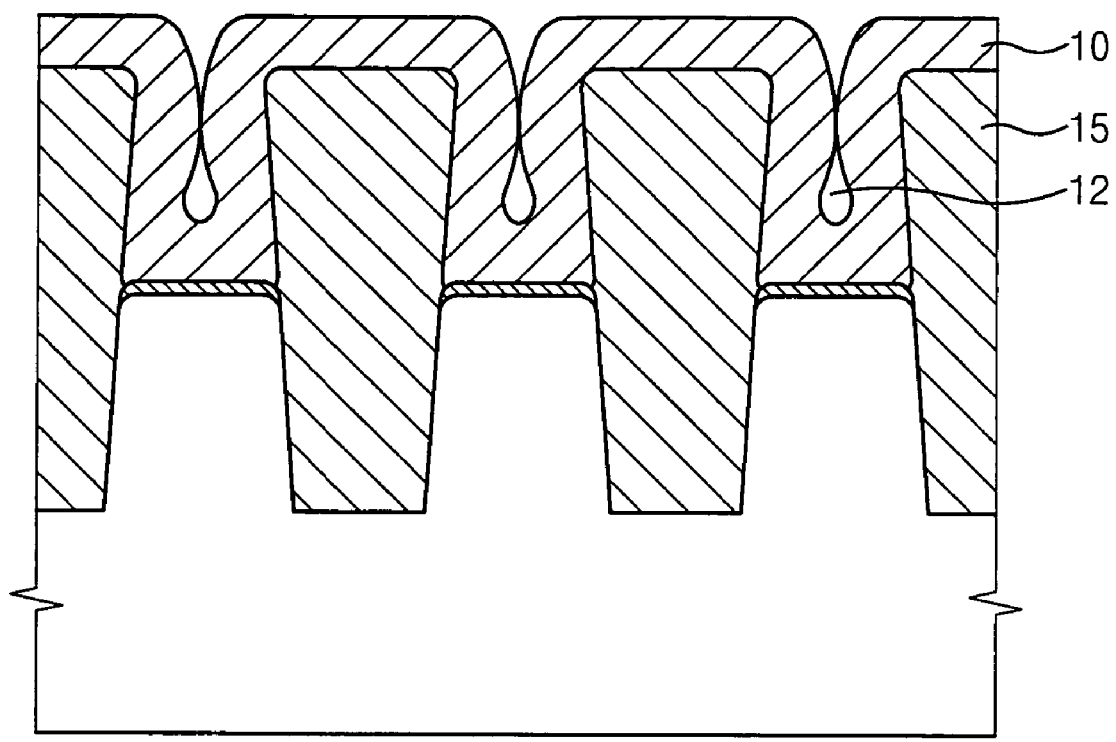
FIG. 1 is a cross sectional view illustrating a seam generated in a polysilicon layer for floating gate of a conventional flash memory device.

The present invention now will be described more fully hereinafter with reference to the accompanying drawings, in which exemplary embodiments of the invention are shown. The present invention may, however, be embodied in many different forms and should not be construed as limited to the exemplary embodiments set forth herein; rather, these embodiments are provided so that this disclosure will be through and complete, and will fully convey the scope of the invention to those skilled in the art. In the drawings, the thickness of layers and regions are exaggerated for clarity. Like reference numerals refer to similar or identical elements throughout. It will be understood that when an element such as a layer, region or substrate is referred to as being "on" or "onto" another element, it can be directly on the other element or intervening elements may also be present.

FIGS. 2 to 13 are cross sectional views illustrating a method of manufacturing a semiconductor device in accordance with an exemplary embodiment of the present invention.

Figure 2:
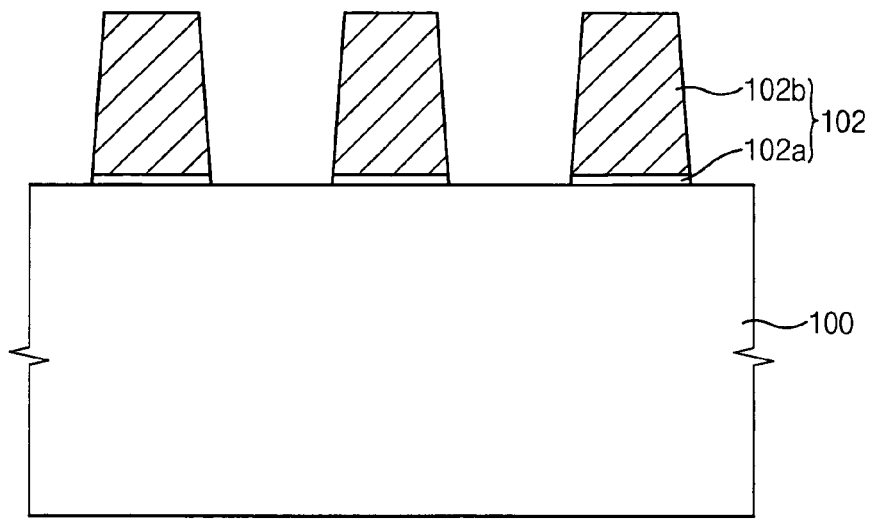
FIGS. 2 to 13 are cross sectional views illustrating a method of manufacturing a semiconductor device in accordance with an exemplary embodiment of the present invention.

Referring to FIG. 2, after a buffer layer is formed on a substrate 100, a first insulation layer is formed on the buffer layer. The buffer layer may be formed using an oxide such as silicon oxide, and the substrate 100 may include a silicon wafer. The first insulation layer may be formed using a material that has an etching selectivity relative to the buffer layer. For example, the first insulation layer includes a nitride such as silicon nitride.

After a photoresist film is formed on the first insulation layer, the photoresist film is exposed and developed to thereby form a photoresist pattern (not shown) on the first insulation layer.

The first insulation layer and the buffer layer are partially etched using the photoresist pattern as an etching mask, thereby forming a hard mask pattern 102 on the substrate 100. The hard mask pattern 102 includes a buffer layer pattern 102a formed on the substrate 100 and a first insulation layer pattern 102b formed on the buffer layer pattern 102a. The hard mask pattern 102 selectively exposes a field region of the substrate 100. After the hard mask pattern 102 is formed on the substrate 100, the photoresist pattern is removed from the hard mask pattern 102 by an ashing process and/or a stripping process. Alternatively, the photoresist pattern may be consumed in an etching process for forming a trench 108 (see FIG. 3) without performing any additional process.

The hard mask pattern 102 serves as an etching mask in an isolation process for forming the trench 108 so that the hard mask pattern 102 defines an active region of the substrate 100 where a floating gate 123 (see FIG. 12) is positioned. The hard mask pattern 102 may have a thickness substantially thicker than that of the floating gate 123. However, a second insulation layer may not completely fill up the trench 108 if the hard mask pattern 102 is too thick compared to the floating gate. Therefore, the hard mask pattern 102 may have a thickness about 5% to about 15% thicker than that of the floating gate 123. When the hard mask pattern 102 is employed for defining the active region where the floating gate 123 is formed, the hard mask pattern 102 may have a thickness relatively thicker than that of a conventional hard mask pattern used only as an etching mask for forming a trench.

In an exemplary embodiment of the present invention, the buffer layer and the first insulation layer may be etched by a dry etching process. When the buffer layer pattern 102a and the first insulation layer pattern 102b are formed through the dry etching process, sidewalls of the buffer and the first insulation layer patterns 102a and 102b may have slopes with predetermined angles. In other words, the hard mask pattern 102 may have a lower portion relatively wider than an upper portion thereof. Hence, an area of the substrate 100 masked by the hard mask pattern 102 may be relatively wider than an area of the substrate 100 masked by the photoresist pattern. When the substrate 100 is partially etched using the hard mask pattern 102 having the above-described structure, the trench 108 may have a width relatively narrower than that of an area of the hard mask pattern 102 exposed by the photoresist pattern.

An oxide layer (not shown) is formed on the substrate 100 exposed by the hard mask pattern 102. The oxide layer may be formed by a thermal oxidation process or a chemical vapor deposition (CVD) process. For example, the oxide layer includes silicon oxide. When the oxide layer is formed through the thermal oxidation process, silicon oxide layers are formed on portions of the substrate 100 making contact with lower edge portions of the hard mask pattern 102 in accordance with the consumption of the substrate 100 due to bird's beak phenomenon. As the substrate 100 is partially consumed, the portions of the substrate 100 contacting the lower edge portions of the hard mask pattern 102 may have round shapes. In one embodiment of the present invention, the oxide layer may not be formed on the substrate 100 to simplify the method of manufacturing the semiconductor device.

Figure 3:
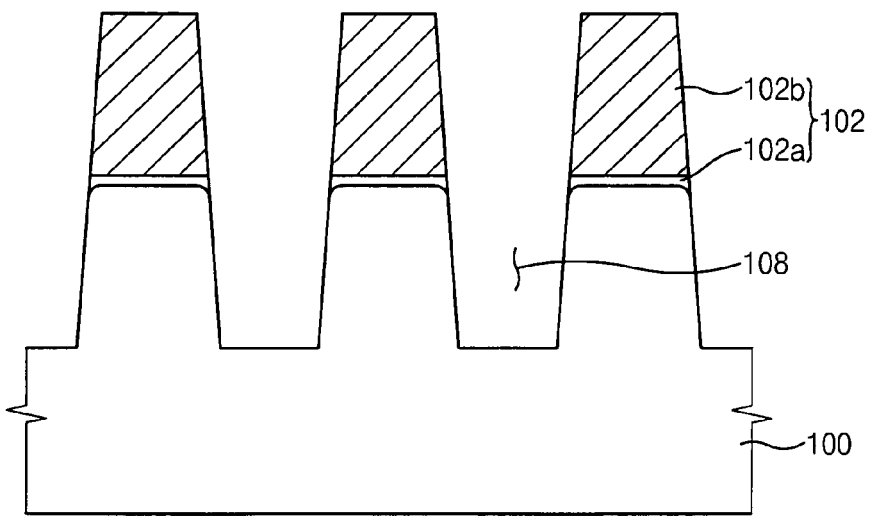

Referring to FIG. 3, the trench 108 is formed by partially etching the substrate 100 using the hard mask pattern 102 as an etching mask. When the trench 108 is formed on the substrate 108, the field region and the active region are defined on the substrate 100. That is, the field region corresponds to the trench 108, whereas the active region corresponds to a portion of the substrate 100 where the hard mask pattern 102 is positioned.

A sidewall oxide layer (not shown) is formed on a sidewall of the trench 108 by a thermal oxidation process or a CVD process. The sidewall oxide layer is formed to cure the damage to the substrate 100 generated in the etching process of forming the trench 108. The sidewall oxide layer may have a thickness of about 30 Å to about 200 Å. In one embodiment of the present invention, an additional oxide layer may be formed on the sidewall oxide layer by a CVD process using middle temperature oxide (MTO). The additional oxide layer may prevents the damage to the substrate 100 generated in a successive process of forming the second insulation layer that fills up the trench 108.

Figure 4:
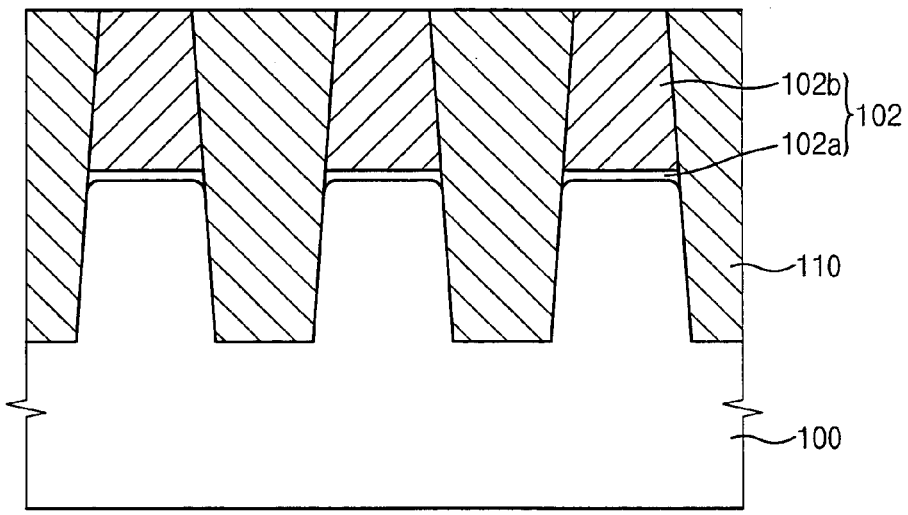

Referring to FIG. 4, the second insulation layer is formed on the substrate 100 to fill up the trench 108 and to cover the hard mask pattern 102. The second insulation layer may be formed using oxide by a high density plasma chemical vapor deposition (HDP-CVD) process (hereinafter, referred to as HDP-CVD oxide). In the HDP-CVD process, the second insulation layer is formed by simultaneously performing a depositing step and a sputtering step. Thus, the second insulation layer may have a dense structure and a high electrical insulation property so that the second insulation layer may be advantageously used as an isolation layer 110 of the semiconductor device.

An upper portion of the second insulation layer is removed by a planarization process until the hard mask pattern 102 is exposed, thereby forming the isolation layer 110 in the trench 108. The second insulation layer may be partially removed by a chemical mechanical polishing (CMP) process, an etch back process or a combination process of CMP and etch back.

Figure 5:
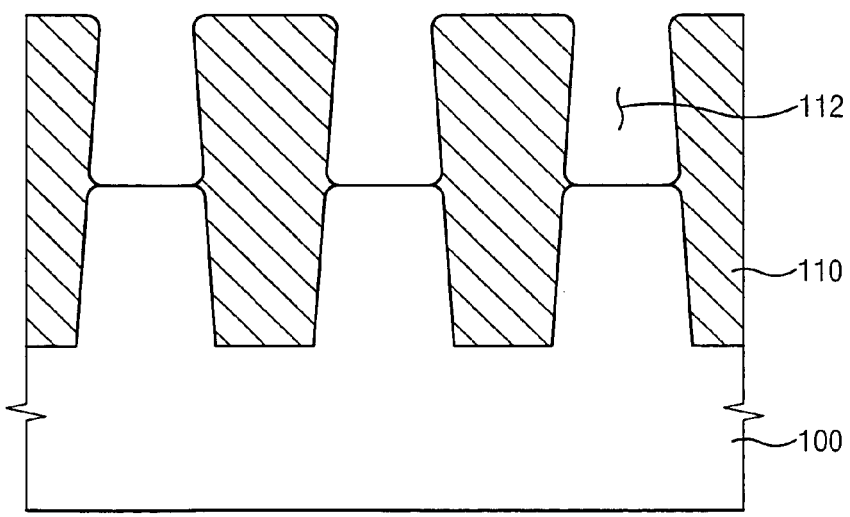

Referring to FIG. 5, the hard mask pattern 102 is removed from the substrate 100 by an etching process. When the hard mask pattern 102 is removed, the active region of the substrate 100 is exposed. The hard mask pattern 102 may be etched by a wet etching process. In the wet etching process, the hard mask pattern 102 is etched using an etching solution that mainly etches a nitride. Here, the etching solution may include phosphoric acid ($H_3PO_4$). When the first insulation layer pattern 102b including nitride is removed using the etching solution including phosphoric acid, the buffer layer pattern 102a of oxide may be simultaneously removed from the substrate 100 without any additional process for etching the buffer layer pattern 102a.

When the hard mask pattern 102 is removed, an opening 112 is formed at a position where the hard mask 102 is located. That is, the opening 112 exposing the active region of the substrate 100 is formed between the isolation layers 110. Here, an upper face of the isolation layer 110 is substantially higher than that of the active region. Since the lower portion of the hard mask pattern 102 is relatively wider than the upper portion thereof, a lower portion of the opening 112 is also relatively wider than an upper portion of the opening 112.

Figure 6:
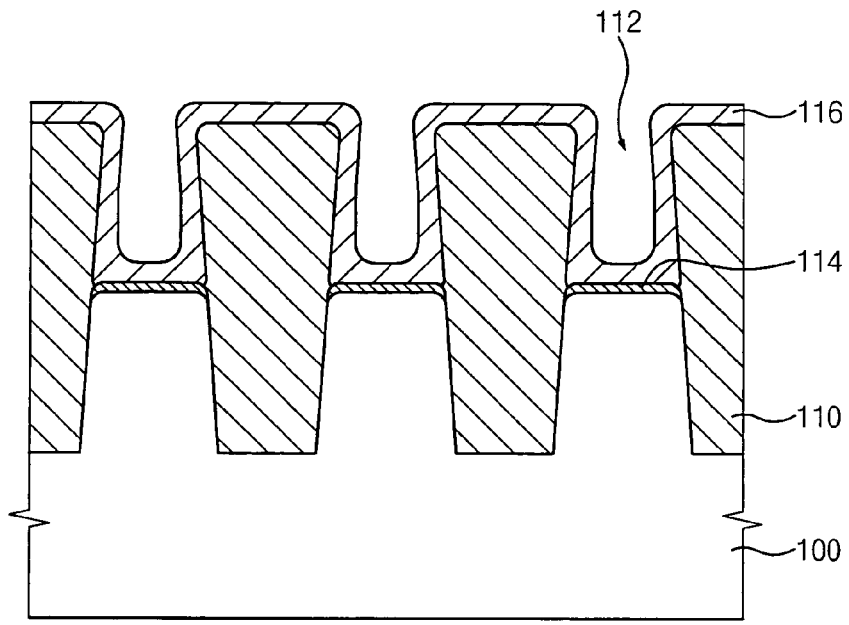

Referring to FIG. 6, a first dielectric layer 114 is formed on the active region. The first dielectric layer 114 may include an oxide such as silicon oxide. Further, the first dielectric layer 114 may be formed using a thermal oxidation process or a CVD process. The first dielectric layer 114 serves as a tunnel oxide layer of the semiconductor device.

A first preliminary polysilicon layer 116 is formed on the first dielectric layer 114, a sidewall of the isolation layer 110 and an upper face of the isolation layer 110. Thus, the opening 112 is partially filled with the first preliminary polysilicon layer 116. The first preliminary polysilicon layer 116 may be formed using a low pressure chemical vapor deposition (LPCVD) process. Impurities may be doped into the first preliminary polysilicon layer 116 by a diffusion process, an ion implantation process or an in-situ doping process.

Because the first preliminary polysilicon layer 116 has good step coverage, the first preliminary polysilicon layer 116 may have a thickness substantially smaller than a half of a width of the upper portion of the opening 112 so that the first preliminary polysilicon layer 116 partially fills up the opening 112. Preferably, the first preliminary polysilicon layer 116 may have a thickness substantially smaller than about one-third of the width of the upper portion of the opening 112.

Figure 7:
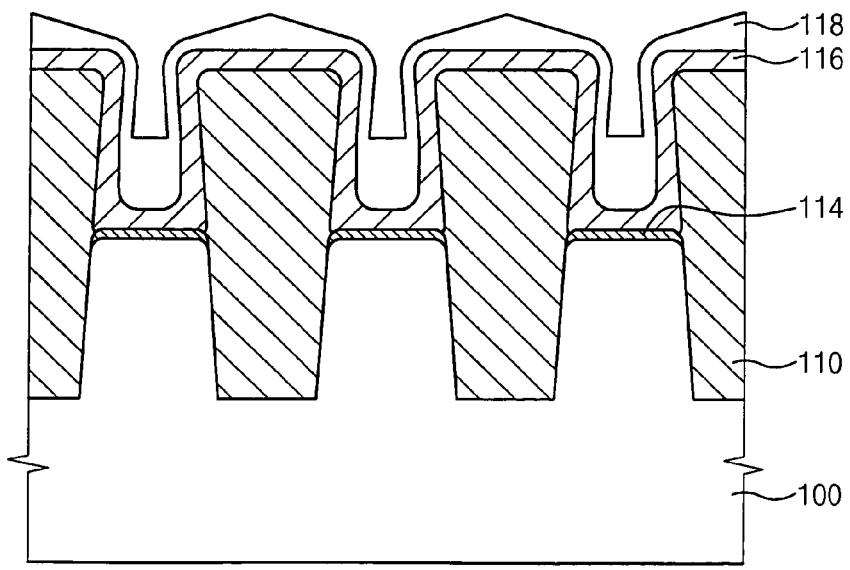

Referring to FIG. 7, a sacrificial layer 118 is formed on the first preliminary polysilicon layer 116. The sacrificial layer 118 protects a portion of the first preliminary polysilicon layer 116 in a successive etching process. The sacrificial layer 118 may include an oxide such as HDP-CVD oxide. The sacrificial layer 118 has a first thickness from a bottom face of the opening 112 and a second thickness from the sidewall of the opening 112. The second thickness of the sacrificial layer 118 is relatively thinner than the first thickness of the sacrificial layer 118. When the sacrificial layer 118 is formed on the first preliminary polysilicon layer 116, approximately half of the opening 112 is filled with the sacrificial layer 118.

Figure 8:
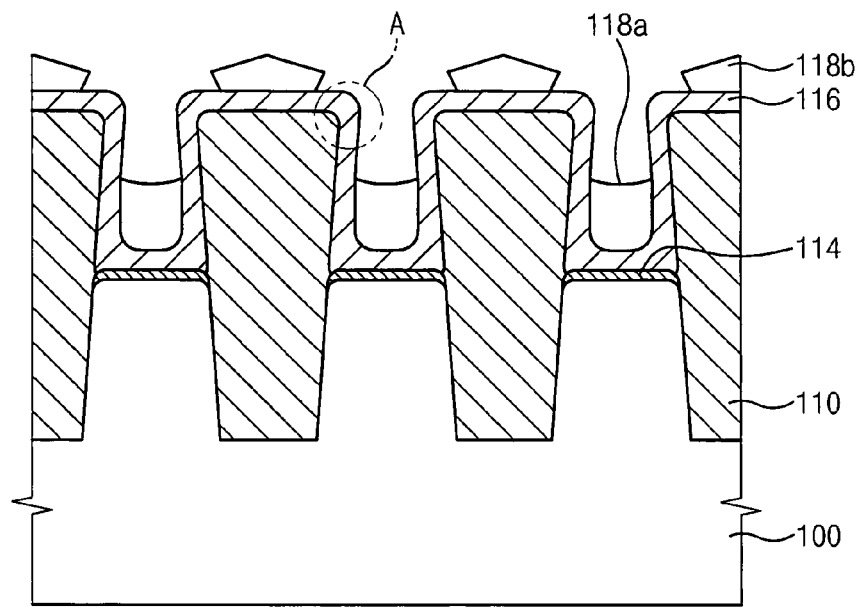

Referring to FIG. 8, the sacrificial layer 118 is partially etched to thereby form first and second sacrificial layer patterns 118a and 118b. The first sacrificial layer pattern 118a is formed in the opening 112 and the second sacrificial layer pattern 118b is positioned on the isolation layer 110. That is, the first sacrificial layer pattern 118a is formed on a portion of the first preliminary polysilicon layer 116 positioned on the bottom face of the opening 112, whereas the second sacrificial layer pattern 118b is formed on a portion of the first preliminary polysilicon layer 116 positioned on the isolation layer 110. When the first and second sacrificial layer patterns 118a and 118b are formed, a portion A of the first preliminary polysilicon layer 116 positioned on and around a shoulder portion of the isolation layer 110 is exposed.

The first and the second sacrificial layer patterns 118a and 118b may be formed by a wet etching process using an etching solution. The etching solution may include a diluted hydrogen fluoride (HF) solution or an LAL solution. The LAL solution typically includes ammonium fluoride ($NH_3F$), hydrogen fluoride and deionized water ($H_2O$). In the wet etching process for partially etching the sacrificial layer 118, processing time of the etching process is properly controlled considering an etching rate of the sacrificial layer 118. Thus, the first and the second sacrificial layer patterns 118a and 118b are formed on the first preliminary polysilicon layer 116 so that the portion A of the first preliminary polysilicon layer 116 on the shoulder portion of the isolation layer 110 is exposed.

Figure 9:
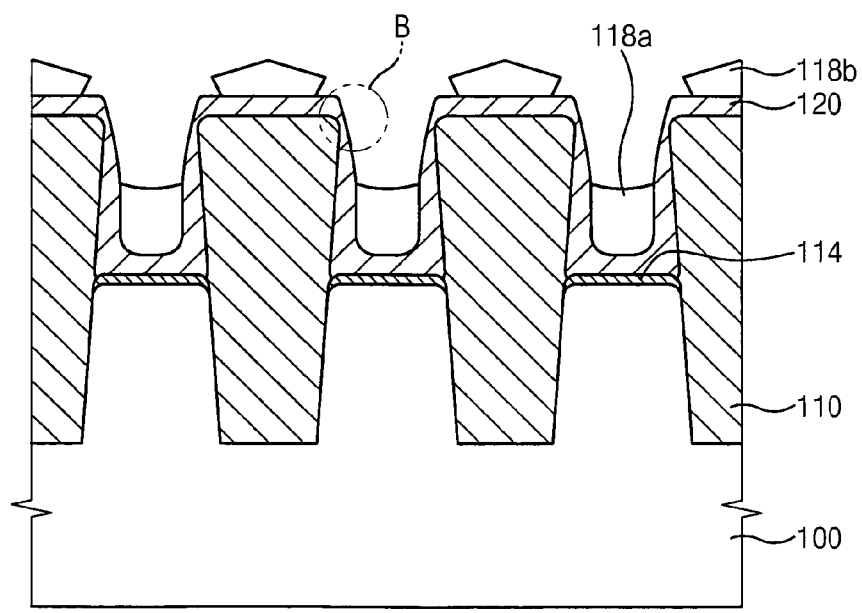

Referring to FIG. 9, the exposed portion A of the first preliminary polysilicon layer 116 is partially or completely etched to form a first polysilicon layer 120 on the first dielectric layer 114, the upper face of the field isolation layer 110 and the sidewall of the isolation layer 110. Since the exposed portion of the first preliminary polysilicon layer 116 is partially or fully etched as shown "B", the width of the upper portion of the opening 112 is increased by an etched thickness of the exposed portion A of the first preliminary polysilicon layer 116. That is, although the exposed portion A of the first preliminary polysilicon layer 116 is partially etched as shown "B" in FIG. 9, the exposed portion A of the first preliminary polysilicon layer 116 may be fully etched to increase the width of the upper portion of the opening 112.

The first polysilicon layer 120 may be formed by a wet etching process. When the first preliminary polysilicon layer 116 is etched by a dry etching process, the first preliminary polysilicon layer 116 may not be properly etched because the second sacrificial layer pattern 118b is positioned on the isolation layer 110. Further, the dry etching process may cause damage to the first dielectric layer 114 formed beneath the first preliminary polysilicon layer 116.

In the wet etching process of etching the first preliminary polysilicon layer 116, an etching solution having an etching selectivity of more than about 1:10 between the sacrificial layer patterns 118a and 118b and the first preliminary polysilicon layer 116. When the sacrificial layer patterns 118a and 118b are etched together with the first preliminary polysilicon layer 116, the first sacrificial layer pattern 118a may not cover the portion of the first preliminary polysilicon layer 116 positioned on the first dielectric layer 114, thereby causing damage to the first dielectric layer 114. The etching solution may include ammonium hydroxide ($NH_4OH$), hydrogen peroxide ($H_2O_2$) and deionized water. For NSC-1 solution contains ammonium hydroxide, hydrogen peroxide and deionized water with a volume ratio of about 3 to about 10: about 1: about 60 to about 200. Preferably, the etching solution includes the NCS-1 solution that contains ammonium hydroxide, hydrogen peroxide and deionized water with a volume ratio of about 4: about 1: about 95. The wet etching process may be performed at a temperature of about 70 to about 90° C. Preferably, the exposed portion A of the first preliminary polysilicon layer 116 may be partially or completely etched at a temperature of about 80° C.

When the wet etching process of etching the exposed portion A of the first preliminary polysilicon layer 116 is carried out at the temperature of about 80° C. using the etching solution including the NCS-1 solution that contains ammonium hydroxide, hydrogen peroxide and deionized water with a volume ratio of about 4: about 1: about 95, an etching selectivity of the first preliminary polysilicon layer 116 relative to the sacrificial layer patterns 118a and 118b is about 12.5:1. For example, an etching rate of the first preliminary polysilicon layer 116 is about 31.5 Å/min, and an etching rate of the sacrificial layer patterns 118a and 118b is about 2.5 Å/min.

Figure 10:
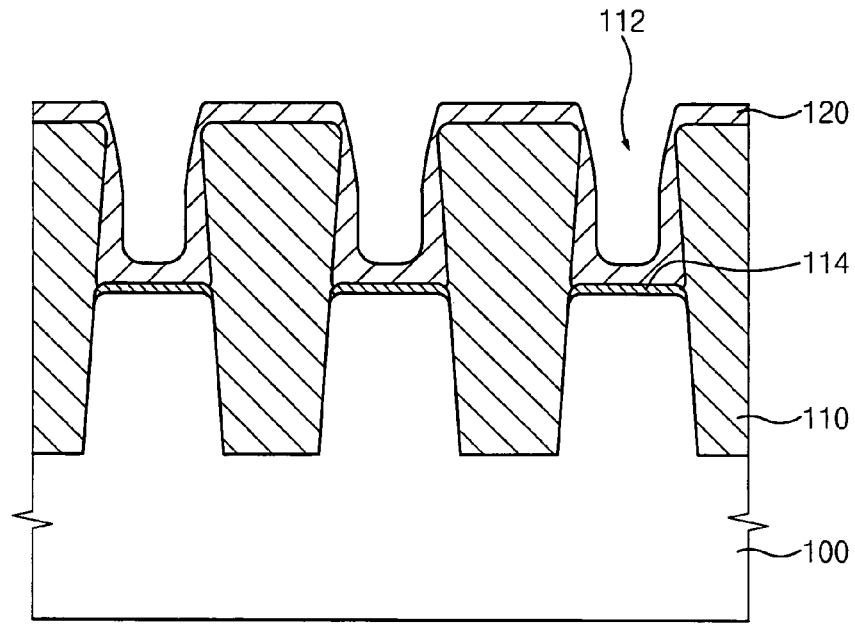

Referring to FIG. 10, the first and the second sacrificial layer patterns 118a and 118b are removed to complete the first polysilicon layer 120. Since the exposed portion A of the first preliminary polysilicon layer 116 is partially or fully etched as describe above, the opening 112 has the upper portion having the increased width by the etched thickness of the first preliminary polysilicon layer 116. Hence, the upper portion of the opening 112 has a width substantially wider than that of the lower portion thereof. In other words, the sidewall of the opening 112 has a positive slope relative to a vertical line to the substrate 100.

The first and the second sacrificial layer patterns 118a and 118b may be removed from the first polysilicon layer 120 by a wet etching process. In the wet etching process, an etching solution for etching the sacrificial layer patterns 118a and 118b may include a diluted hydrogen fluoride solution or an LAL solution.

Figure 11:
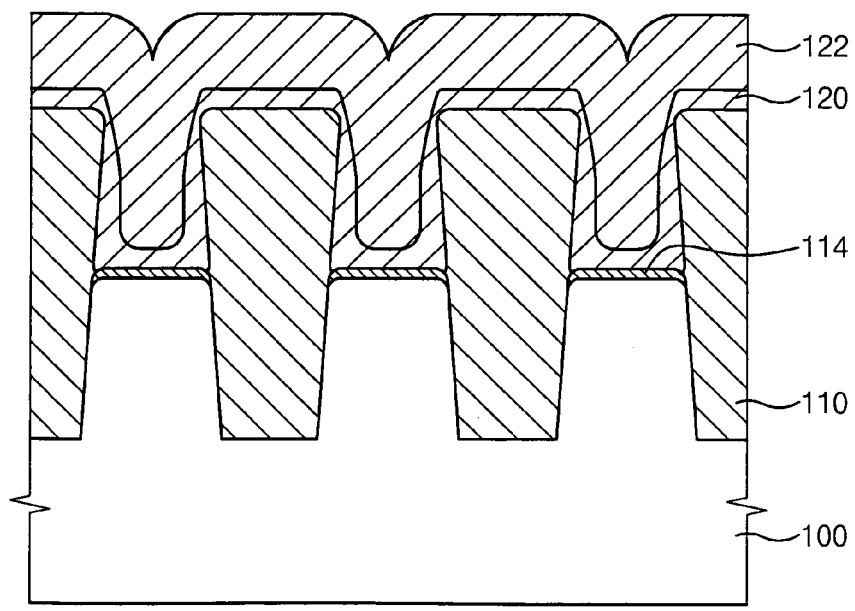

Referring to FIG. 11, a second polysilicon layer 122 is formed on the first polysilicon layer 120 to completely fill up the opening 112. When the second polysilicon layer 122 fills up the opening 112, no seam or void is generated in the second polysilicon layer 122 because the opening 112 has the upper portion having the increased width.

Figure 12:
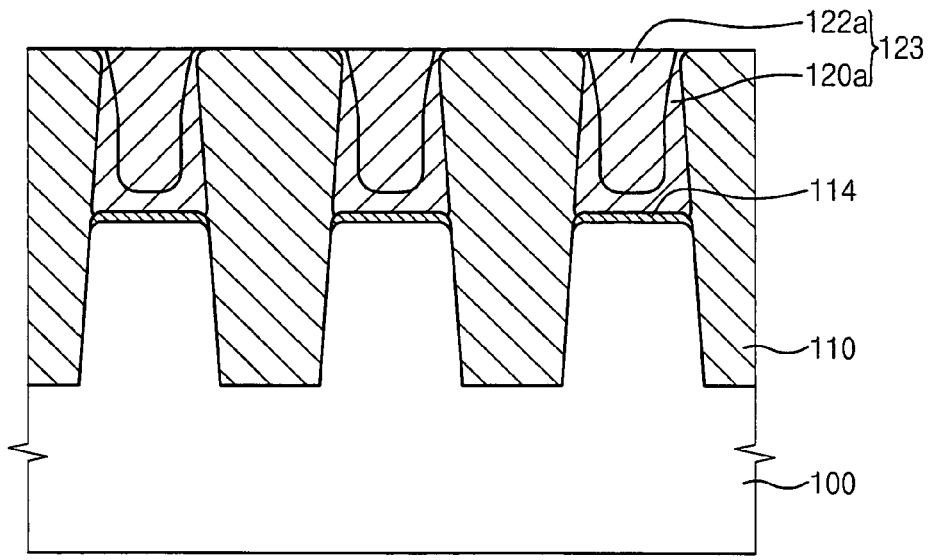

Referring to FIG. 12, the first and the second polysilicon layer 120 and 122 are partially removed by a planarization process until the isolation layer 110 is exposed, thereby forming the floating gate 123 in the active region of the substrate 100. The first and the second polysilicon layer 120 and 122 may be partially removed by a CMP process, an etch back process or a combination process of CMP or an etch back.

The floating gate 123 includes a first polysilicon layer pattern 120a and a second polysilicon layer pattern 122a. The first polysilicon layer pattern 120a is formed on the first dielectric layer 114 and the sidewall of the opening 112, and the second polysilicon layer pattern 122a is positioned on the first polysilicon layer pattern 120a to fill up the opening 112.

Figure 13:
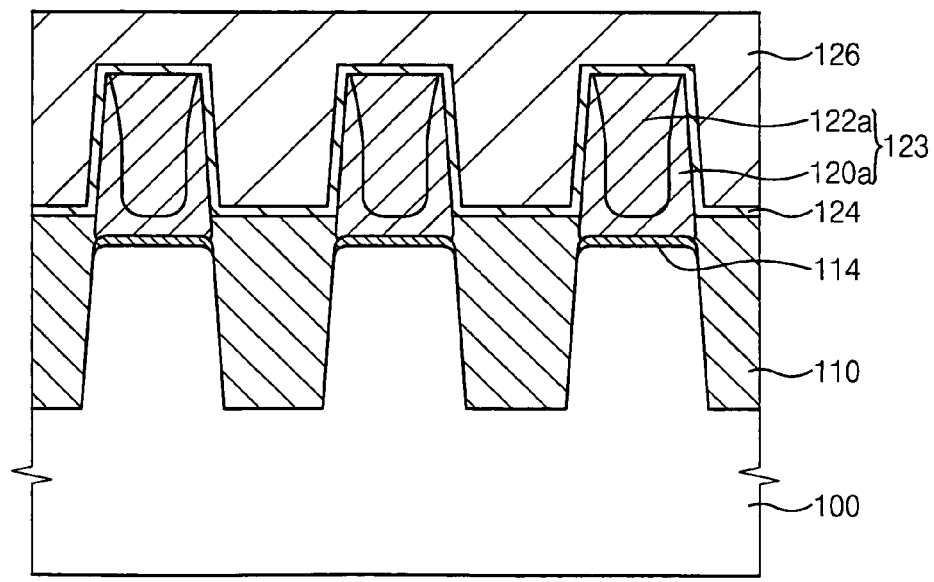

Referring to FIG. 13, an upper portion of the isolation layer 110 is etched by a wet etching process for a dry etching process to thereby expose a sidewall of the floating gate 123. Here, an upper face of the etched isolation layer 110 is substantially higher than a bottom face of the floating gate 123. That is, the sidewall of the floating gate 123 is partially exposed after the isolation layer 110 is partially removed. Thus, the first dielectric layer 114 is not exposed after the etching process of the isolation layer 110. As a result, the first dielectric layer 114 may not be damaged in the etching process of the isolation layer 110 and/or successive manufacturing processes.

A second dielectric layer 124 is formed on the etched isolation layer 110 and the floating gate 123. The second dielectric layer 124 may be formed using a material having a high dielectric constant. Alternatively, the second dielectric layer 124 may have an oxide/nitride/oxide (ONO) structure that includes a lower oxide film, a nitride film and an upper oxide film sequentially formed on the floating gate 123.

A conductive layer 126 is formed on the second dielectric layer 124. The conductive layer 126 may be formed using a conductive material such as doped polysilicon, metal or a conductive metal nitride. Alternatively, the conductive layer 126 may have a polyside structure that includes a doped polysilicon film and a metal silicide film.

The conductive layer 126 is patterned by a typical photolithography process to thereby form a control gate (not shown) on the second dielectric layer 124. Then, the second dielectric layer 124, the floating gate 123 and the first dielectric layer 114 are partially etched, thereby forming a gate structure of the semiconductor device on the substrate 100.

When source/drain regions (not shown) are formed at portions of active region adjacent to the gate structure by an ion implantation process, the semiconductor device such as a flash memory device is completed on the substrate 100.

FIGS. 14 to 17 are cross sectional views illustrating a method of manufacturing a semiconductor device in accordance with an exemplary embodiment of the present invention.

Figure 14:
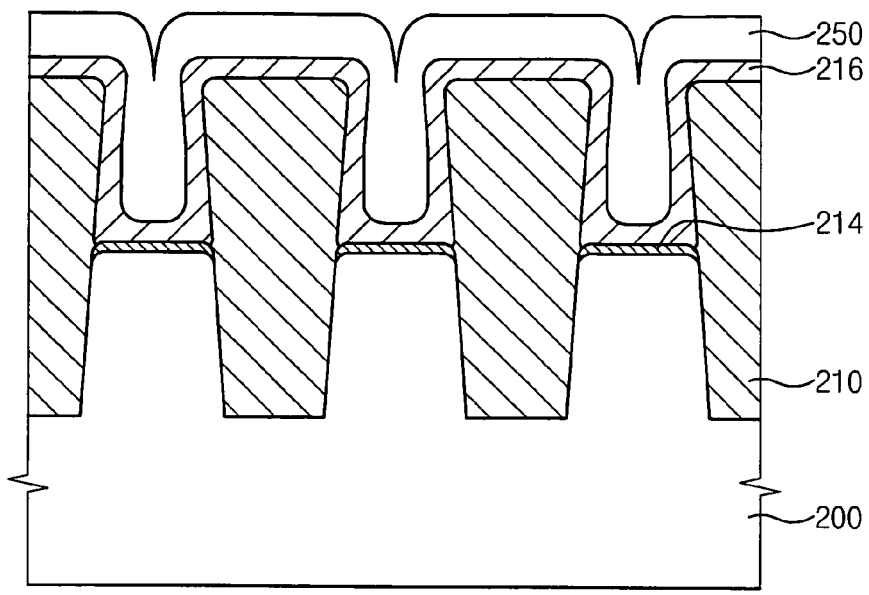
FIGS. 14 to 17 are cross sectional views illustrating a method of manufacturing a semiconductor device in accordance with an exemplary embodiment of the present invention.

Referring to FIG. 14, after a buffer layer is formed on a substrate 200, a first insulation layer is formed on the buffer layer. The buffer layer may be formed using an oxide such as silicon oxide, and the first insulation layer may be formed using a nitride such as silicon nitride.

After a photoresist pattern is formed on the first insulation layer, the first insulation layer and the buffer layer are partially etched using the photoresist pattern as an etching mask so that a hard mask pattern is formed on the substrate 200. The hard mask pattern includes a buffer layer pattern and a first insulation layer pattern successively formed on the substrate 200. The hard mask pattern selectively exposes a field region of the substrate 200.

A trench is formed by partially etching the substrate 200 using the hard mask pattern as an etching mask so that the field region and the active region are defined on the substrate 200.

A second insulation layer is formed on the substrate 200 to fill up the trench and to cover the hard mask pattern. The second insulation layer may be formed using oxide by an HDP-CVD process.

An upper portion of the second insulation layer is removed by a planarization process until the hard mask pattern is exposed, so that an isolation layer 210 is formed in the trench. The second insulation layer may be partially removed by a CMP process, an etch back process or a combination process of CMP and etch back.

The hard mask pattern is removed from the substrate 200 by an etching process so that the active region of the substrate 200 is exposed. When the hard mask pattern is removed, an opening is formed at a position where the hard mask is positioned. The opening exposing the active region of the substrate 200 is formed between the isolation layers 210 substantially higher than the active region.

A first dielectric layer 214 is formed on the active region using an oxide such as silicon oxide by a thermal oxidation process or a CVD process. The first dielectric layer 214 may serve as a tunnel oxide layer of the semiconductor device.

A first preliminary polysilicon layer 216 is formed on the first dielectric layer 214, a sidewall of the isolation layer 210 and an upper face of the isolation layer 210. Thus, the opening is partially filled with the first preliminary polysilicon layer 216. The first preliminary polysilicon layer 216 may be formed using an LPCVD process. Additionally, impurities may be doped into the first preliminary polysilicon layer 216 by a diffusion process, an ion implantation process or an in-situ doping process.

A sacrificial layer 250 is formed on the first preliminary polysilicon layer 216 to fill up the opening. The sacrificial layer 250 may be formed using an oxide such as undoped silicate glass (USG), boro-phosphor silicate glass (BPSG), flowable oxide (FOX), etc. The sacrificial layer 250 has a first thickness from a bottom face of the opening and a second thickness from the sidewall of the opening. The second thickness of the sacrificial layer 250 is relatively thinner than the first thickness of the sacrificial layer 250.

Figure 15:
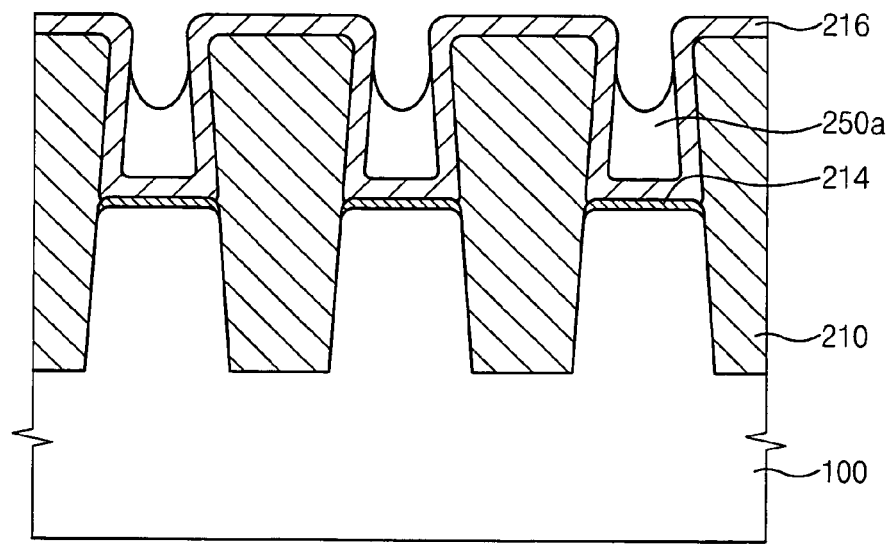

Referring to FIG. 15, the sacrificial layer 250 is partially etched to thereby form a sacrificial layer pattern 250a in the opening. That is, the sacrificial layer pattern 250a is formed on a portion of the first preliminary polysilicon layer 216 positioned on the bottom face of the opening.

The sacrificial layer 250 may be partially etched by a wet etching process using an etching solution. The etching solution may include a diluted hydrogen fluoride solution or an LAL solution. Alternatively, the sacrificial layer pattern 250 may be formed in the opening by a dry etching process.

When the sacrificial layer pattern 250a is formed in the opening, portions of the first preliminary polysilicon layer 216 are exposed. That is, portions of the first preliminary polysilicon layer 216 positioned on the isolation layer 210 and an upper sidewall of the opening are exposed in accordance with partial etching of the sacrificial layer 250.

Figure 16:
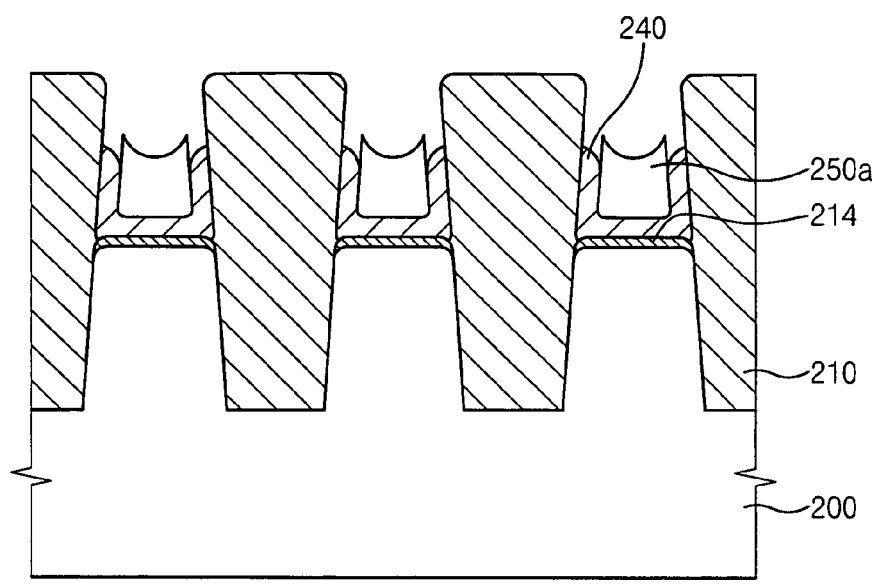

Referring to FIG. 16, the exposed portions of the first preliminary polysilicon layer 216 are removed to thereby form a first polysilicon layer 240 on the first dielectric layer 214 and the sidewall of the isolation layer 210. Namely, the first polysilicon layer 240 is formed a portion of the sidewall of the opening. The first polysilicon layer 240 may be formed by a wet etching process. When the first preliminary polysilicon layer 216 is etched by a dry etching process using a plasma, the first preliminary polysilicon layer 216 may not be properly etched because the sacrificial layer pattern 250a is formed on the isolation layer 210. Additionally, the plasma used in the dry etching process may cause damage to the first dielectric layer 214 formed beneath the first preliminary polysilicon layer 216.

In the wet etching process of etching the first preliminary polysilicon layer 216, an etching solution having an etching selectivity of more than about 1:10 between the sacrificial layer pattern 250a and the first preliminary polysilicon layer 216.

Figure 17:
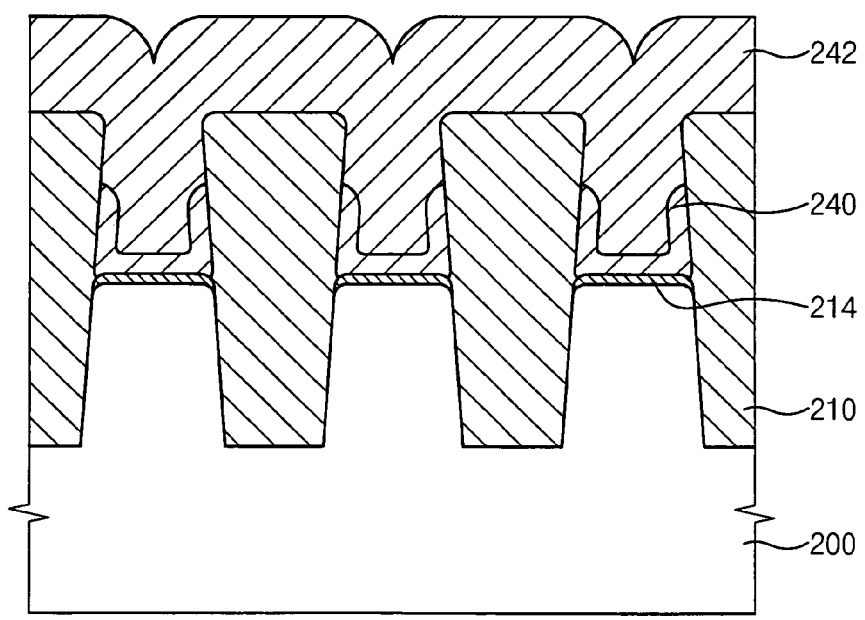

Referring to FIG. 17, the sacrificial layer pattern 250a is completely removed to expose the first polysilicon layer 240. Because the first polysilicon layer 240 is formed on the bottom face and a lower sidewall of the opening, the opening may have a reduced aspect ratio. In addition, a width of a lower portion of the opening may be reduced by a thickness of the first polysilicon layer 240. That is, the opening has an upper portion having a width relatively wider than the lower portion thereof by the thickness of the first polysilicon layer 240.

The sacrificial layer pattern 250a may be removed from the first polysilicon layer 240 by a wet etching process. In the wet etching process, an etching solution for etching the sacrificial layer pattern 250a may include a diluted hydrogen fluoride solution or an LAL solution.

A second polysilicon layer 242 is formed on the first polysilicon layer 240 and isolation layer 210 to completely fill up the opening. When the second polysilicon layer 242 fills up the opening, no seam or void is generated in the second polysilicon layer 242 because the opening has the upper portion having the increased width in accordance with formation of the first polysilicon layer 240.

The second polysilicon layer 242 is partially removed by a planarization process until the isolation layer 210 is exposed so that a floating gate is formed in the active region of the substrate 200. The second polysilicon layer 242 may be partially removed by a CMP process, an etch back process or a combination process of CMP or an etch back.

The floating gate includes a first polysilicon layer pattern and a second polysilicon layer pattern. The first polysilicon layer pattern is formed on the first dielectric layer 214 and the lower sidewall of the opening, and the second polysilicon layer pattern is positioned on the first polysilicon layer pattern to fill up the opening.

After an upper portion of the isolation layer 210 is etched to thereby expose a sidewall of the floating gate, a second dielectric layer is formed on the etched isolation layer 210 and the floating gate.

A conductive layer is formed on the second dielectric layer, and then the conductive layer is patterned to thereby form a control gate on the second dielectric layer. After the second dielectric layer, the floating gate and the first dielectric layer 214 are partially etched to form a gate structure of the semiconductor device on the substrate 200, source/drain regions are formed at portions of active region adjacent to the gate structure by an ion implantation process. As a result, the semiconductor device such as a flash memory device is completed on the substrate 200.

According to the present invention, no seam or void is generated in a polysilicon layer for a floating gate while the polysilicon layer is formed in a self-aligned process relative to an isolation layer formed on a substrate. Therefore, a semiconductor device including the polysilicon layer such as a flash memory device may have improved electrical characteristics and reliability.

Having thus described exemplary embodiments of the present invention, it is to be understood that the invention defined by the appended claims is not to be limited by particular details set forth in the above description as many apparent variations thereof are possible without departing from the spirit or scope thereof as hereinafter claimed.

What is claimed is:

1. A method of manufacturing a semiconductor device, comprising:
   forming an isolation pattern on a substrate, the isolation pattern including an opening that exposes a portion of the substrate;
   forming a preliminary polysilicon layer on the substrate and the isolation pattern to partially fill up the opening;
   forming a sacrificial layer on the preliminary polysilicon layer;
   partially etching the sacrificial layer to expose a portion of the preliminary polysilicon layer formed on a shoulder portion of the isolation pattern;
   forming a first polysilicon layer by etching the exposed portion of the preliminary polysilicon layer to enlarge an upper width of the opening;
   removing the etched sacrificial layer; and
   forming a second polysilicon layer on the first polysilicon layer to fill up the enlarged opening.

2. The method of claim 1, wherein the sacrificial layer has a first thickness at a bottom face of the opening, and a second thickness substantially thinner than the first thickness at an upper sidewall of the opening.

3. The method of claim 2, wherein the sacrificial layer is formed by a high density plasma chemical vapor deposition (HDP-CVD) process.

4. The method of claim 1, wherein the sacrificial layer has a first thickness at a bottom face of the opening, and a second thickness substantially thinner than the first thickness on the isolation pattern.

5. The method of claim 4, wherein the sacrificial layer comprises any one selected from the group consisting of undoped silicate glass (USG), boro-phosphor silicate glass (BPSG) and flowable oxide (FOX).

6. The method of claim 1, wherein partially etching the sacrificial layer and removing the etched sacrificial layer are performed by wet etching processes, respectively.

7. The method of claim 1, wherein forming the first polysilicon layer is performed by a wet etching process using an etching solution having an etching selectivity of above about 1:10 between the sacrificial layer and the preliminary polysilicon layer.

8. A method of manufacturing a semiconductor device, comprising:
   forming a mask pattern on a substrate;
   forming trenches on the substrate by etching the substrate using the mask pattern as an etching mask;
   forming isolation layers to fill up the trenches;
   forming an opening by removing the mask pattern to expose an active region of the substrate between the isolation layers;
   forming a first dielectric layer on the exposed active region;
   forming a preliminary polysilicon layer on the first dielectric layer and the isolation layers to partially fill up the opening;
   forming a sacrificial layer on the preliminary polysilicon layer, the sacrificial layer having a first thickness from at a bottom face of the opening, and a second thickness substantially thinner than the first thickness at an upper sidewall of the opening;

partially etching the sacrificial layer to expose a portion of the preliminary polysilicon layer formed on a shoulder portion of the opening;

forming a first polysilicon layer by etching the exposed portion of the preliminary polysilicon layer to enlarge an upper width of the opening;

removing the etched sacrificial layer;

forming a second polysilicon layer on the first polysilicon layer to fill up the enlarged opening; and forming a floating gate by removing the second and first polysilicon layers until the isolation layers are exposed.

9. The method of claim 8, wherein the sacrificial layer is formed by an HDP-CVD process.

10. The method of claim 8, wherein partially etching the sacrificial layer and removing the etched sacrificial layer are carried out by wet etching processes, respectively.

11. The method of claim 10, wherein the wet etching process is performed using an etching solution including a diluted hydrogen fluoride (HF) solution or an LAL solution.

12. The method of claim 8, wherein forming the first polysilicon layer is performed by a wet etching process using an etching solution having an etching selectivity of above about 1:10 between the sacrificial layer and the preliminary polysilicon layer.

13. The method of claim 12, wherein the etching solution comprises ammonium hydroxide (NH$_4$OH), hydrogen peroxide (H$_2$O$_2$) and deionized water with a volume ratio of about 3 to about 10:about 1:about 60 to about 200.

14. The method of claim 8, further comprising:
partially removing the isolation layers to partially expose a sidewall of the floating gate;
forming a second dielectric layer on the floating gate; and
forming a control gate on the second dielectric layer.

15. A method of manufacturing a semiconductor device, comprising:
forming a mask pattern on a substrate;
forming trenches on the substrate by etching the substrate using the mask pattern as an etching mask;
forming isolation layers to fill up the trenches;
forming an opening by removing the mask pattern to expose an active region of the substrate between the isolation layers;
forming a first dielectric layer on the exposed active region;
forming a preliminary polysilicon layer on the first dielectric layer and the isolation layers to partially fill up the opening;
forming a sacrificial layer on the preliminary polysilicon layer, the sacrificial layer having a first thickness at a bottom face of the opening, and a second thickness substantially thinner than the first thickness on the isolation layers;

partially etching the sacrificial layer to expose portions of the preliminary polysilicon layer formed on the isolation layer and a shoulder portion of the opening;

forming a first polysilicon layer by etching the exposed portions of the preliminary polysilicon layer to enlarge an upper width of the opening;

removing the etched sacrificial layer;

forming a second polysilicon layer on the first polysilicon layer to fill up the enlarged opening; and forming a floating gate by removing the second and first polysilicon layers until the isolation layers are exposed.

16. The method of claim 15, wherein the sacrificial layer comprises any one selected from the group consisting of undoped silicate glass (USG), boro-phosphor silicate glass (BPSG) and flowable oxide (FOX).

17. The method of claim 15, wherein partially etching the sacrificial layer and removing the etched sacrificial layer are carried out by wet etching processes, respectively.

18. The method of claim 17, wherein the wet etching process is performed using an etching solution including a diluted hydrogen fluoride (HF) solution or an LAL solution.

19. The method of claim 15, wherein forming the first polysilicon layer is performed by a wet etching process using an etching solution having an etching selectivity of above about 1:10 between the sacrificial layer and the preliminary polysilicon layer.

20. The method of claim 15, further comprising:
partially removing the isolation layers to partially expose a sidewall of the floating gate;
forming a second dielectric layer on the floating gate; and
forming a control gate on the second dielectric layer.

21. The method of claim 1, further comprising partially etching the polysilicon layer formed on the shoulder portion of the isolation pattern so that a remaining portion exists.

22. The method of claim 1, further comprising completely etching the polysilicon layer formed on the shoulder portion of the isolation patterns so the isolation pattern is exposed.

23. The method of claim 1, wherein the preliminary polysilicon layer has a thickness that is substantially smaller than about one-third a width of an upper portion of the opening.

24. The method of claim 23, wherein the sacrificial layer thickness at an upper portion of the opening is approximately one-half of the width of the upper portion of the opening.

* * * * *